(12) United States Patent
Hayashi

(10) Patent No.: US 7,728,444 B2
(45) Date of Patent: Jun. 1, 2010

(54) WIRING BOARD

(75) Inventor: Akimori Hayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 221 days.

(21) Appl. No.: 12/007,352

(22) Filed: Jan. 9, 2008

(65) Prior Publication Data

US 2008/0164622 A1 Jul. 10, 2008

(30) Foreign Application Priority Data

Jan. 10, 2007 (JP) ............................. 2007-002635

(51) Int. Cl.
*H01L 23/52* (2006.01)
*H01L 23/48* (2006.01)
*H01L 29/40* (2006.01)

(52) U.S. Cl. ............................. 257/786; 257/E23.019; 257/723; 257/773; 257/781; 370/360; 370/388; 370/411; 438/612

(58) Field of Classification Search .......... 257/E27.108, 257/E23.019, 691–695, 698, 700, 773–776, 257/685, 723, 781, 786; 370/411, 419, 427, 370/362, 388, 386, 360; 438/612
See application file for complete search history.

(56) References Cited

U.S. PATENT DOCUMENTS

| | | | | |
|---|---|---|---|---|
| 5,020,059 A | * | 5/1991 | Gorin et al. ..................... | 714/3 |
| 5,557,779 A | * | 9/1996 | Minami .......................... | 716/6 |
| 5,708,597 A | * | 1/1998 | Kelem .................... | 365/230.03 |
| 5,983,008 A | * | 11/1999 | Kumashiro et al. ............. | 716/6 |
| 6,622,233 B1 | * | 9/2003 | Gilson .......................... | 712/11 |
| 6,731,627 B1 | * | 5/2004 | Gupta et al. ................. | 370/352 |
| 6,741,616 B1 | * | 5/2004 | Sutherland et al. .......... | 370/535 |
| 7,139,266 B2 | * | 11/2006 | Li et al. ....................... | 370/360 |
| 7,143,382 B2 | * | 11/2006 | Teig et al. .................... | 716/12 |

FOREIGN PATENT DOCUMENTS

JP 2004-119454 4/2004

* cited by examiner

*Primary Examiner*—Chris C Chu
(74) *Attorney, Agent, or Firm*—McGinn IP Law Group, PLLC

(57) ABSTRACT

A difference in delay of signal transmission due to the wiring within a board is minimized. A wiring board includes wiring for connecting terminals included in one of a plurality of semiconductor chips to terminals included in another one of the plurality of semiconductor chips, through branch points. Each of the plurality of semiconductor chips includes first and second terminals. Moreover, a first wiring up to the first terminals and a second wiring up to the second terminals are in a positional relationship of being shifted parallel to each other in a planar direction of the wiring board so as not to come into electrical contact with each other. In each of the first and second wirings, a wire is provided between a connection point for the terminal in a first one of the semiconductor chips and a position of a root, a complete binary tree structure in which all leaves are at the same depth from the root is formed, connection points for the terminals in the rest of the semiconductor chips are positioned at the respective leaves, and the paths of wires respectively corresponding to branches at the same depth in the tree structure include vias and the lengths of the paths of wires including the lengths of the vias are equal to each other.

11 Claims, 3 Drawing Sheets

WIRING BOARD

BACKGROUND OF THE INVENTION

1. Field of the Invention

The present invention relates to a wiring board and more particularly relates to a wiring board including wiring for connecting terminals included in one of a plurality of semiconductor chips to terminals included in another one of the plurality of semiconductor chips, through branch points.

2. Description of the Related Art

There are a wide variety of electronic devices that implement one-to-many connection between a plurality of semiconductor chips, for example, between one memory controller chip and a plurality of random access memories (hereinafter referred to as RAMs), all of which are mounted on a board. Such boards include a board having a plurality of semiconductor chips or semiconductor modules mounted thereon, such as a semiconductor package board, a printed circuit board, a system-in-package board and a multichip module board.

In the connection between a memory controller chip and a plurality of RAM chips, wiring for a plurality of signals on data, address, clock, clock enable and chip select are drawn out by bus wiring method, branched in the middle and connected to the plurality of RAM chips. In order to complete, within the board, functions of such a system including two kinds of chips, the memory controller chip and the RAM chips, it is preferable that all the bus wiring paths between the memory controller chip and the RAM chips be set to have an equal length, thereby eliminating a phase difference due to wiring delay in signal transmission.

Japanese Patent Application Laid-open No. 2004-119454 (Patent Document 1) discloses a printed circuit board in which all wires in a bus wiring are set to have an equal length. FIGS. 3A and 3B are views schematically showing a structure of the printed circuit board disclosed in the Patent Document 1. FIG. 3A is a plan view. In FIGS. 3A and 3B, one memory controller IC 102 and two RAMs 103 and 104 are mounted on a printed wiring board 100. The printed wiring board 100 is a semiconductor package board including two layers, which are a front-side and a back-side layers, each layer having wiring. Reference numeral 110 denotes a bus wiring path which connects the memory controller IC 102 to the RAM 103. The bus wiring paths 110 are provided on the front-side layer of the printed wiring board 100. Reference numeral 111 denotes a bus wiring path which connects the memory controller IC 102 to the RAM 104. The bus wiring paths 111 are respectively provided by branching the bus wiring paths 110, which are extended from the memory controller IC 102, at vias 120 and are connected to the back-side layer of the printed wiring board 100. The bus wiring paths 110 and 111 are line-symmetrically drawn out toward the RAMs 103 and 104, respectively, from the vias 120 to be branch points. Moreover, the bus wiring paths 111 are routed back to the front-side layer of the printed wiring board 100 through vias 121 and are connected to the RAM 104.

Here, in the bus wiring paths 110, the positions of the vias 120 are determined so that the wires from the vias 120 to the memory controller IC 102 can be parallel to each other and have an equal length. Moreover, the positions of the vias 120 are determined so that the length of the each wire from the corresponding via 120 to the RAM 103 in the bus wiring paths 110 and the length of each wire from the corresponding via 120 to the RAM 104 in the bus wiring paths 111 can be linearly equal to each other. Since the RAMs 103 and 104 are identical RAM chips, the wires are connected to the RAM 103 at identical positions where the wires are connected to the RAM 104. Therefore, the vias 120 are disposed at middle points between the RAMs 103 and 104 while the series of vias 120, the RAMs 103 and 104 are arranged in parallel with one another.

FIG. 3B is a perspective view schematically showing the printed circuit board shown in FIG. 3A. The printed circuit board has the structure in which the length of each wire from the via 120 to the RAM 103 in the bus wiring paths 110 and the length of each wire from the via 120 to the RAM 104 in the bus wiring 111 are set to be equal to each other. However, with reference to FIG. 3B, the length of each wire leading from the vias 120 to the RAM 103 and the length of each wire leading from the via 120 to the RAM 104 are not completely equal. Specifically, in the wiring paths from the memory controller IC 102 to the RAM 104, the vias 120 and 121 are used to provide wiring to connect the front-side and back-side layers. Therefore, the wiring length from the memory controller IC 102 to the RAM 104 is longer than the wiring length from the memory controller IC 102 to the RAM 103 by the lengths of the vias 120 and 121.

Meanwhile, there has recently been an increasing demand for higher-speed memories up to beyond gigabit speed. Accordingly, great importance has been placed on the impact of wiring delay on signal transmission. Thus, there is an increasing need to set all the bus wiring paths between the memory controller chip and the RAMs to have an equal length. However, according to the conventional technology, the lengths of all the bus wiring paths cannot be set completely equal since some include the lengths of the vias while other do not. Therefore, there is a difference in delay of signal transmission among the wiring paths within the board. As a result, there is an increasing risk that a stable operation cannot be guaranteed in an operation beyond the gigabit speed.

SUMMARY OF THE INVENTION

The inventors of the present invention have reached the present invention by determining that designing should be done also in consideration of a length of a via in order to achieve completely equal-length connections between a plurality of semiconductor chips planar-mounted on a semiconductor package board.

A wiring board according to one aspect of the present invention can mount at least first to $2^n+1$th (n is an integer of 1 or more) semiconductor chips and includes: a wiring for connecting terminals included in the first to $2^n+1$th semiconductor chips to each other through branch points. In this wiring board, each of the first to $2^n+1$th semiconductor chips includes first and second terminals, and a first wiring within the wiring board up to the first terminals and a second wiring within the wiring board up to the second terminals are in a positional relationship of being shifted parallel to each other in a planar direction of the wiring board so as not to come into electrical contact with each other. Moreover, in each of the first and second wirings, a wire is provided between a connection point for the terminal in the first semiconductor chip and a position of a root, a complete binary tree structure in which all leaves are at the same depth from the root is formed, connection points for the terminals in the second to $2^n+1$th semiconductor chips are positioned at the respective leaves, and the paths of wires respectively corresponding to branches at the same depth in the tree structure include vias and the lengths of paths of wires including the lengths of the vias are equal to each other.

A wiring board according to another aspect of the present invention mounts at least first and second semiconductor chips and includes: a first wiring which connects between a first connection point and respective first terminals in the first and second semiconductor chips; and a second wiring which connects between a second connection point and respective second terminals in the first and second semiconductor chips. Each of the first and second wirings includes a first via, a second via, a first wiring pattern which connects a first end of the first via to a first end of the second via in a first wiring layer, a branch point formed in the middle of the first wiring pattern, a second wiring pattern which has a first end connected to the branch point, a third wiring pattern which has a first end connected to a second end of the first via in a second wiring layer, and a fourth wiring pattern which has a first end connected to a second end of the second via in the second wiring layer and has a length equal to that of the third wiring pattern. In the first wiring, a second end of the second wiring pattern is connected to the first connection point, a second end of the third wiring pattern is connected to a connection point for the first terminal in the first semiconductor chip, and a second end of the fourth wiring pattern is connected for a connection point to the first terminal in the second semiconductor chip. Moreover, in the second wiring, the second end of the second wiring pattern is connected to the second connection point, the second end of the third wiring pattern is connected to a connection point for the second terminal in the first semiconductor chip, and the second end of the fourth wiring pattern is connected to a connection point for the second terminal in the second semiconductor chip. Furthermore, the first and second wirings are in a relationship of being mapped parallel to each other in a planar direction of the wiring board so as not to come into electrical contact with each other.

A wiring board according to another aspect of the present invention mounts at least first to third semiconductor chips and includes: a first wiring which connects between first terminals in the respective first to third semiconductor chips; and a second wiring which connects between respective second terminals in the respective first to third semiconductor chips. Each of the first and second wirings includes a first via, a second via, a first wiring pattern which connects a first end of the first via to a first end of the second via in a first wiring layer, a branch point formed in the middle of the first wiring pattern, a second wiring pattern which has a first end connected to the branch point, a third wiring pattern which has a first end connected to a second end of the first via in a second wiring layer, and a fourth wiring pattern which has a first end connected to a second end of the second via in the a second wiring layer and has a length equal to that of the third wiring pattern. In the first wiring, the second end of the second wiring pattern is connected to a connection point for the first terminal in the first semiconductor chip, the second end of the third wiring pattern is connected to a connection point for the first terminal in the second semiconductor chip, and the second end of the fourth wiring pattern is connected to a connection point for the first terminal in the third semiconductor chip. Moreover, in the second wiring, the second end of the second wiring pattern is connected to a connection point for the second terminal in the first semiconductor chip, the second end of the third wiring pattern is connected to a connection point for the second terminal in the second semiconductor chip, and the second end of the fourth wiring pattern is connected to a connection point for the second terminal in the third semiconductor chip. Furthermore, the first and second wirings are in a relationship of being mapped parallel to each other in a planar direction of the wiring board so as not to come into electrical contact with each other.

According to the present invention, it is possible to set path lengths from the first semiconductor chip to the second to $2^n+1$th semiconductor chips to be completely equal including the lengths of the vias and also to minimize a difference in delay of signal transmission due to the wiring within the board.

DESCRIPTION OF PREFERRED THE EMBODIMENTS

Figure 1:
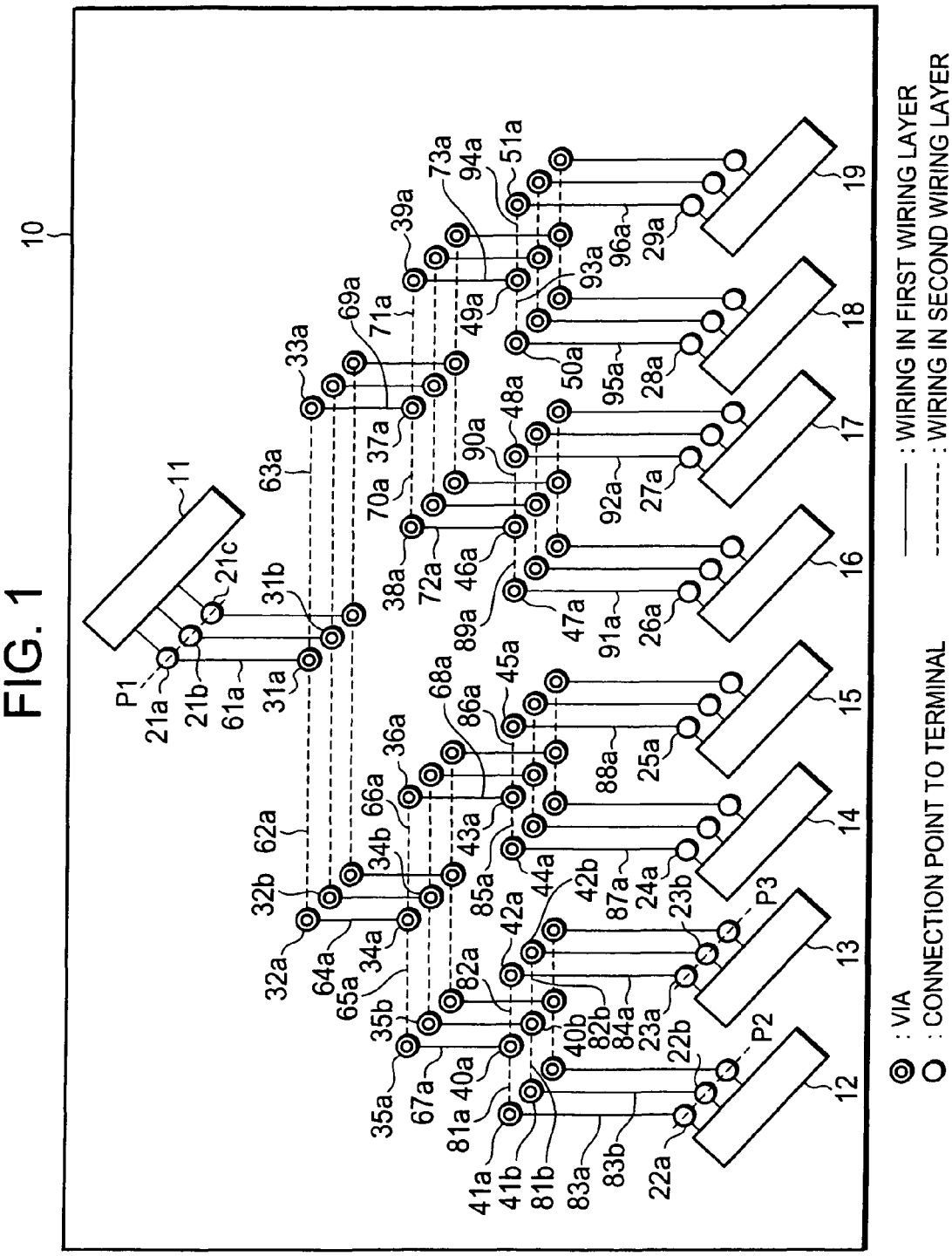
FIG. 1 is a view schematically showing a structure of a wiring board according to a first example of the present invention.

A wiring board (reference numeral 10 in FIG. 1) according to an embodiment of the present invention can mount at least first to $2^n+1$th semiconductor chips (reference numerals 11 to 19 in FIG. 1) and includes wiring for connecting terminals respectively included in the first to $2^n+1$th semiconductor chips to each other through branch points. In this wiring board, each of the first to $2^n+1$th semiconductor chips includes first and second terminals. Moreover, a first wiring within the wiring board up to the first terminals and a second wiring within the wiring board up to the second terminals are in a positional relationship of being shifted parallel to each other in a planar direction of the wiring board so as not to come into electrical contact with each other. Furthermore, in each of the first and second wirings, a wire is provided between a connection point (21a in FIG. 1) for the terminal in the first semiconductor chip and a position (a via 31a in FIG. 1) of a root (a top-level node), a complete binary tree structure in which all leaves are at the same depth from the root is formed, connection points for the terminals in the second to $2^n+1$th semiconductor chips are positioned at the respective leaves, and the path of wires respectively corresponding to branches at the same depth in the tree structure include vias (32a, 33a, 35a, 36a, 38a, 39a, 41a, 42a, 44a, 45a, 47a, 48a, 50a and 51a in FIG. 1) and the lengths of the paths of wires including the lengths of the vias are equal to each other. Here, the via means a part for connecting two or more wirings to each other, which are provided in separate wiring layers in a multilayer board.

The wiring board is a board which can mount first to third semiconductor chips, for example, in the case of n=1 and includes first and second wirings each for connecting between a terminal to which an I/O in the first semiconductor chip is connected and terminals to which respective I/Os in the second and third semiconductor chips are connected. Moreover, the first and second wirings are formed of first and second wiring layers. In this board, the first to third semiconductor chips may be arranged on the board in such a manner that three straight lines respectively obtained by connecting the terminals of the first to third semiconductor chips are set parallel to each other. Furthermore, each of the first and second wirings may respectively include a first via, a second via, a branch point and a first to forth wiring patterns. The first wiring pattern connects a first end of the first via to a first end of the second via and is formed of a first wiring layer. The branch point is formed in the middle of the first wiring pattern. The second wiring pattern connects the branch point to the first semiconductor chip. The third wiring pattern connects a second end of the first via to the second semiconductor chip. The fourth wiring pattern connects a second end of the second via to the third semiconductor chip. The first and second wirings may be in a relationship of being mapped parallel to each other in the same direction as the three straight lines. Here, the wiring pattern means a certain portion of the wiring in the entire board.

Moreover, in the wiring board, it is preferable that, in each of the first and second wirings, first vias (31a, 34a, 37a, 40a, 43a, 46a and 49a in FIG. 1) exist at the position of the root and at positions of respective nodes, wires corresponding to a first branch in a leaf direction connected to the root and the respective nodes include second vias (32a, 35a, 38a, 41a, 44a, 47a and 50a in FIG. 1), wires corresponding to a second branch in the leaf direction connected to the root and the respective nodes include third vias (33a, 36a, 39a, 42a, 45a, 48a and 51a in FIG. 1), and a wiring length between first ends of the first and second vias is set equal to a wiring length between first ends of the first and third vias.

Furthermore, in the wiring board, it is preferable that a wire between the first ends of the first and second vias and a wire between the first ends of the first and third vias in each of the branches at the same depth in the tree structure are provided in the same wiring layer, and a wire from a second end of the second via to a second end of a first via at a next node and a wire from a second end of the third via to a second end of another first via at a next node in each of the branches at the same depth in the tree structure are provided in another same wiring layer.

Moreover, in the wiring board, it is preferable that a wire from the connection point for the terminal in the first semiconductor chip to the second end of the first via at the position of the root, a wire from the second end of the second via to the second end of the first via at the next node in each of the branches, a wire from the second end of the second via to the connection point at the leaf in each of the branches, a wire from the second end of the third via to the second end of another first via at the next node in each of the branches and a wire from the second end of the third via to the connection point at another leaf in each of the branches are provided in a first wiring layer, and the wiring between the first ends of the first and second vias and the wiring between the first ends of the first and third vias are provided in a second wiring layer.

An electronic device may include the first to $2^n+1$th semiconductor chips and the wiring board described above.

The wiring board having the structure as described above makes it possible to set path lengths from the first semiconductor chip to the second to $2^n+1$th semiconductor chips to be completely equal including the lengths of the vias. Therefore, it is made possible to minimize a difference in delay of signal transmission due to the wiring within the wiring board. With reference to the drawings, the wiring board of the present invention will be described in detail below according to examples.

Example 1

FIG. 1 is a view schematically showing a structure of a wiring board according to a first example of the present invention. Here, FIG. 1 shows an example of the case where n=3. In FIG. 1, a wiring board 10 has at least first and second wiring layers (for example, front-side and back-side layers) and can mount semiconductor chips 11 to 19. For example, the semiconductor chip 11 is a memory controller and the semiconductor chips 12 to 19 are RAMs controlled by the memory controller. The wiring board 10 includes wires for connecting terminals included in the respective semiconductor chips 11 to 19 to each other through branch points. Here, the wiring from the semiconductor chip 11 to the semiconductor chips 12 to 19 form a complete binary tree structure in which all leaves are at the same depth from a root.

For example, in the wiring up to a connection point (pad) 21a for the terminals of the semiconductor chip 11, the connection point 21a is connected to a second layer end of a via 31a positioned at the root by a front-side layer wire 61a. Then, the wiring up to the connection point 21a forms a complete binary tree structure in which all leaves are at the same depth from the root. Respective connection points 22a to 29a for the terminals of the semiconductor chips 12 to 19 are positioned at the respective leaves. Moreover, the paths of wires respectively corresponding to branches at the same depth in the tree structure include vias, and the lengths of the paths of wires including the lengths of the vias are equal to each other.

Specifically, in branches at the first depth in the tree structure, (1) the length of a path that leads from a first end of the via 31a to a first end of a via 32a through a back-side layer wire 62a and then leads from a second end of the via 32a to a second end of a via 34a to be a node through a front-side layer wire 64a, and (2) the length of a path that leads from the first end of the via 31a to a first end of a via 33a through a back-side layer wire 63a and then leads from a second end of the via 33a to a second end of a via 37a to be a node through a front-side layer wire 69a are equal.

Here, the vias 32a and 33a have the same length and the wires 62a and 63a have the same length and wiring width. Note that the wires 62a and 63a do not always have to be provided in the back-side layer but may be provided in the same wiring layer (for example, an intermediate layer in a multilayer wiring) as long as those wires do not intersect with the other wires. Moreover, the wires 64a and 69a have the same length and wiring width. Note that the wires 64a and 69a do not always have to be provided in the front-side layer but may be provided in the same wiring layer (for example, another intermediate layer in the multilayer wiring) as long as those wires do not intersect with the other wires.

Moreover, in branches at the second depth in the tree structure, (1) the length of a path that leads from a first end of the via 34a to a first end of a via 35a through a back-side layer wire 65a and then leads from a second end of the via 35a to a second layer end of a via 40a to be a node through a front-side layer wire 67a, (2) the length of a path that leads from a first end of the via 34a to a first end of a via 36a through a back-side layer wire 66a and then leads from a second end of the via 36a to a second end of a via 43a to be a node through a front-side layer wire 68a, (3) the length of a path that leads from a first end of the via 37a to a first end of a via 38a through a back-side layer wire 70a and then leads from a second end of the via 38a to a second end of a via 46a to be a node through a front-side layer wire 72a and (4) the length of a path that leads from a first end of the via 37a to a first end of a via 39a through a back-side layer wire 71a and then leads from a second end of the via 39a to a second end of a via 49a to be a node through a front-side layer wire 73a are equal.

Here, the vias 34a and 37a have the same length, the vias 35a, 36a, 38a and 39a have the same length and the wires 65a, 66a, 70a and 71a have the same length and wiring width. Note that the wires 65a, 66a, 70a and 71a do not always have to be provided in the back-side layer but may be provided in the same wiring layer (for example, an intermediate layer in a multilayer wiring) as long as those wires do not intersect with the other wires. Moreover, the wires 67a, 68a, 72a and 73a have the same length and wiring width. Note that the wires 67a, 68a, 72a and 73a do not always have to be provided in the front-side layer but may be provided in the same wiring layer (for example, another intermediate layer in the multilayer wiring) as long as those wires do not intersect with the other wires.

Furthermore, in branches belonging to a third depth in the tree structure, (1) the length of a path that leads from a first end of the via 40a to a first end of a via 41a through a back-side layer wire 81a and then leads from a second end of the via 41a to the connection point (pad) 22a for the semiconductor chip 12 through a front-side layer wire 83a, (2) the length of a path that leads from a first end of the via 40a to a first end of a via 42a through a back-side layer wire 82a and then leads from a second end of the via 41a to the connection point (pad) 23a for the semiconductor chip 12 through a front-surface wire 83a, (3) the length of a path that leads from a first end of the via 43a to a first end of a via 44a through a back-side layer wire 85a and then leads from a second end of the via 44a to the connection point (pad) 24a for the semiconductor chip 14 through a front-side layer wire 87a, (4) the length of a path that leads from a first end of the via 43a to a first end of a via 45a through a back-side layer wire 86a and then leads from a second end of the via 45a to the connection point (pad) 25a for the semiconductor chip 15 through a front-side layer wire 88a, (5) the length of a path that leads from a first end of the via 46a to a first end of a via 47a through a back-side layer wire 89a and then leads from a second end of the via 47a to the connection point (pad) 26a for the semiconductor chip 16 through a front-side layer wire 91a, (6) the length of a path that leads from a first end of the via 46a to a first end of a via 48a through a back-side layer wire 90a and then leads from a second end of the via 48a to the connection point (pad) 27a for the semiconductor chip 17 through a front-side layer wire 92a, (7) the length of a path that leads from a first end of the via 49a to a first end of a via 50a through a back-side layer wire 93a and then leads from a second end of the via 50a to the connection point (pad) 28a for the semiconductor chip 18 through a front-side layer wire 95a, and (8) the length of a path that leads from a first end of the via 49a to a first end of a via 51a through a back-side layer wire 94a and then leads from a second end of the via 51a to the connection point (pad) 29a for the semiconductor chip 19 through a front-side layer wire 96a are equal.

Here, the vias 40a, 43a, 46a and 49a have the same length and the vias 41a, 42a, 44a, 45a, 47a, 48a, 50a and 51a have the same length. Moreover, the wires 81a, 82a, 85a, 86a, 89a, 90a, 93a and 94a have the same length and wiring width. Note that the wires 81a, 82a, 85a, 86a, 89a, 90a, 93a and 94a do not always have to be provided in the back-side layer but may be provided in the same wiring layer (for example, an intermediate layer in a multilayer wiring) as long as those wires do not intersect with the other wires. Furthermore, the wires 83a, 84a, 87a, 88a, 91a, 92a, 95a and 96a have the same length and wiring width.

Although the wiring up to the connection point 21a have been described above, the wiring up to a connection point 21b and the wiring up to a connection point 21c also have the same structure. Moreover, the wiring up to the connection point 21a, the wiring up to the connection point 21b and the wirings up to the connection point 21c are in a positional relationship of being shifted parallel to each other in a planar direction of the wiring board so as not to come into electrical contact with each other. Moreover, it is preferable that a distance between the wiring up to the connection point 21a and the wiring up to the connection point 21b, and a distance between the wiring up to the connection point 21b and the wiring up to the connection point 21c are set equal in the case of using bus wiring. Furthermore, although the respective wires are indicated by straight lines in FIG. 1, the wires do not always have to be straight lines. Note that reference numerals for the wiring up to the connection point 21b and the wiring up to the connection point 21c are partially omitted to avoid complication in illustration but are provided according to the wiring up to the connection point 21a. Moreover, here, the description was given of the case where there are three sets of wiring (the wiring up to the connection point 21a, the wiring up to the connection point 21b and the wiring up to the connection point 21c). However, two or more sets of wiring may sufficiently serve the purpose. Furthermore, although FIG. 1 shows the case where the depth n in the tree structure is 3, n may be 1 or more.

In the wiring board 10 having the structure as described above, the wiring paths leading from the connection point 21a to the respective connection points 22a to 29a, the wiring paths leading from the connection point 21b to the respective connection points 22b to 29b and the wiring paths leading from the connection point 21c to the respective connection points 22c to 29c are set to a completely equal length including the length of each via. Thus, there is no difference in wiring delay among the paths.

Moreover, in the present invention, not only do all the wiring paths have the equal length but also a constituent element of one of the wiring paths (one of the parts that make up one of the wiring paths) and the corresponding constituent elements of the other wiring paths are on the same wiring layer. Thus, even when the first and second wiring layers have different resistance components or capacity components, these differences equally affect all the constituent elements of the wiring paths that correspond to each other. Therefore, there is no difference also in electrical delay among the paths.

Note that the above description was given of the configuration that enables the semiconductor chips to be mounted at the positions of all the leaves (22a to 29a in FIG. 1) which are the terminals of the binary tree structure. However, the present invention is also applicable to a configuration in which some of the leaf portions are simply terminated (by, for example, inserting termination resistances or the like). By terminating some of the leaf portions, three or more of arbitrary semiconductor chips can be connected through paths having the same length.

Furthermore, suppose a case where a difference in signal delay is to be eliminated at least between the wiring path from the semiconductor chip 11 to the semiconductor chip 12 and the wiring path from the semiconductor chip 11 to the semiconductor chip 13, among those in the wiring having the binary tree structure with the n-level configuration shown in FIG. 1. In this case, these wiring paths have only to have the same configuration from the branch point of the via 40a, for example, to the semiconductor chips 12 and 13, respectively. This is because these wiring paths share the wiring pattern connected to the semiconductor chip 11 up to the node corresponding to the via 40a, in the configuration shown in FIG. 1.

The wiring board shown in FIG. 1 has at least the semiconductor chips 11 to 13. In addition, the wiring board includes: a first wiring connecting the connection points 21a to 23a to the respective terminals of the semiconductor chips 11 to 13; and a second wiring connecting the connection points 21b to 23b to the respective terminals of the semiconductor chips 11 to 13.

Here, a straight line P1 is obtained by connecting the connection points 21a and 21b respectively for the terminals of the semiconductor chip 11, a straight line P2 is obtained by connecting the connection points 22a and 22b respectively for the terminals of the semiconductor chip 12, and a straight line P3 is connecting the connection points 23a and 23b respectively for the terminals of the semiconductor chip 13. In this event, the semiconductor chips are arranged in such a manner that the straight line P1, the straight line P2 and the straight line P3 are parallel to each other.

Here, the first wiring includes the first via 41a, the second via 42a, the branch point (40a) and first to forth wiring patterns. The first wiring pattern (configured of wires 81a and 82a) connects one end of the first via 41a to one end of the second via 42a in one wiring layer (the second wiring layer in FIG. 1). The branch point (40a) is formed in the middle of the first wiring pattern. The second wiring pattern (the wiring path from 21a to 40a through 31a, 32a, 34a and 35a) has one end connected to the branch point (40a). The third wiring pattern (83a) has one end connected to the other end of the first via in another wiring layer (the first wiring layer in FIG. 1). The fourth wiring pattern (84a) has one end connected to the other end of the second via with the another wiring layer (the first wiring layer in FIG. 1) and has a length equal to that of the third wiring pattern.

Moreover, in the first wiring, the other end of the second wiring pattern (the wiring path from 21a to 40a through 31a, 32a, 34a and 35a) is connected to the connection point (21a) for a first terminal of the semiconductor chip 11, the other end of the third wiring pattern (83a) is connected to the connection point (22a) for a first terminal of the semiconductor chip 12, and the other end of the fourth wiring pattern (84a) is connected to the connection point (23a) for a first terminal of the semiconductor chip 13.

Similarly, the second wiring includes a first via 41b, a second via 42b, a branch point (40b) and first to forth wiring patterns. The first wiring pattern (81b and 82b) connects one end of the first via 41b to one end of the second via 42b in one wiring layer (the second wiring layer in FIG. 1). The branch point (40b) is formed in the middle of the first wiring pattern. The second wiring pattern (the wiring path from 21b to 40b through 31b, 32b, 34b and 35b) has one end connected to the branch point (40b). The third wiring pattern (83b) which has one end connected to the other end of the first via in another wiring layer (the first wiring layer in FIG. 1). The fourth wiring pattern (84b) has one end connected to the other end of the second via with the another wiring layer (the first wiring layer in FIG. 1) and has a length equal to that of the third wiring pattern.

Moreover, in the second wiring, the other end of the second wiring pattern (the wiring path from 21b to 40b through 31b, 32b, 34b and 35b) is connected to a connection point (21b) for a second terminal of the semiconductor chip 11, the other end of the third wiring pattern (83b) is connected to a connection point (22b) for a second terminal of the semiconductor chip 12, and the other end of the fourth wiring pattern (84b) is connected to a connection point (23b) for a second terminal of the semiconductor chip 13.

The first and second wirings thus configured are in a relationship of being mapped parallel to each other in the same direction as the straight lines P1 to P3 and in the planar direction of the wiring board so as not to come into electrical contact with each other.

As to the semiconductor chips 11 to 13 configured as described above in FIG. 1, a wiring structure in which uniformity of the wiring layers as well as the vias is secured can be implemented for connection wirings from the semiconductor chip 11 to the semiconductor chips 12 and 13.

Moreover, it is also possible not to include the semiconductor chip 11 in the wiring board 10 shown in FIG. 1 and the connection points 21a to 21c may be set to be external connection terminals of the wiring board 10 for the semiconductor chip 11. In the case of such a wiring board, the present invention can be implemented by providing equal-length wires from the terminals of the semiconductor chip 11, which is outside the wiring board 10, to the connection points 21a to 21c, which is set to be the external connection terminals.

Example 2

Figure 2A:
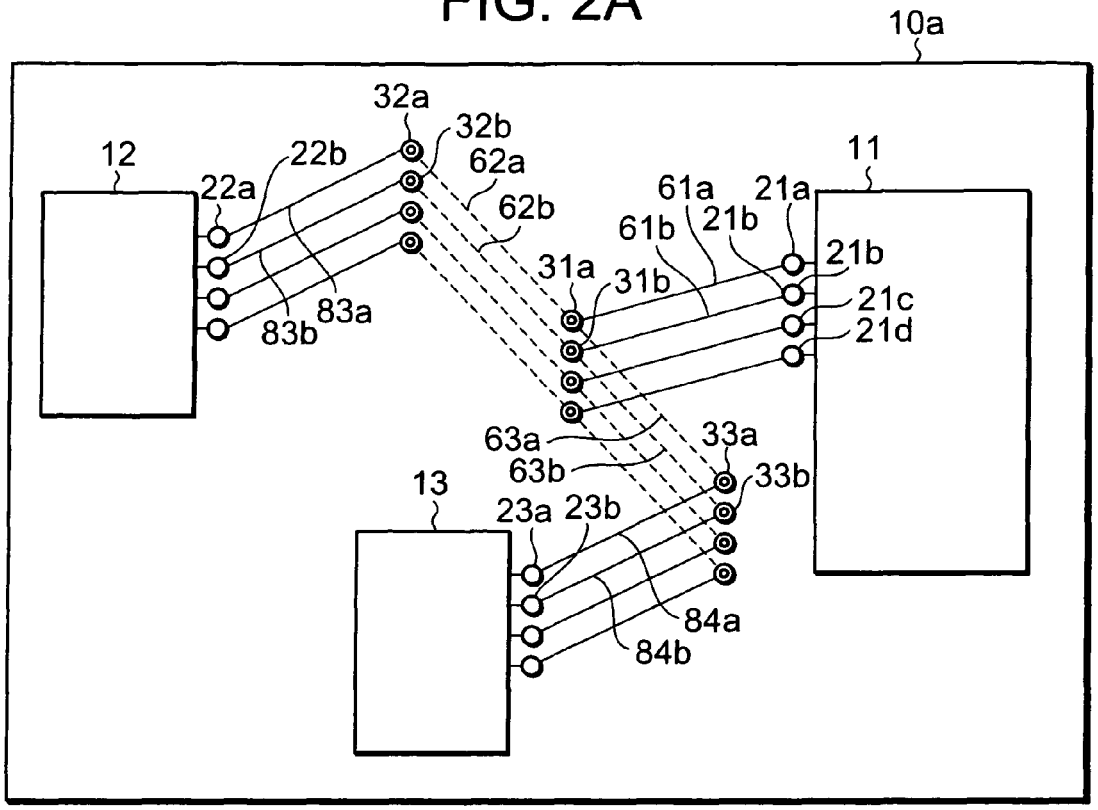
FIGS. 2A and 2B are views schematically showing a structure of a wiring board according to a second example of the present invention.
Figure 2B:
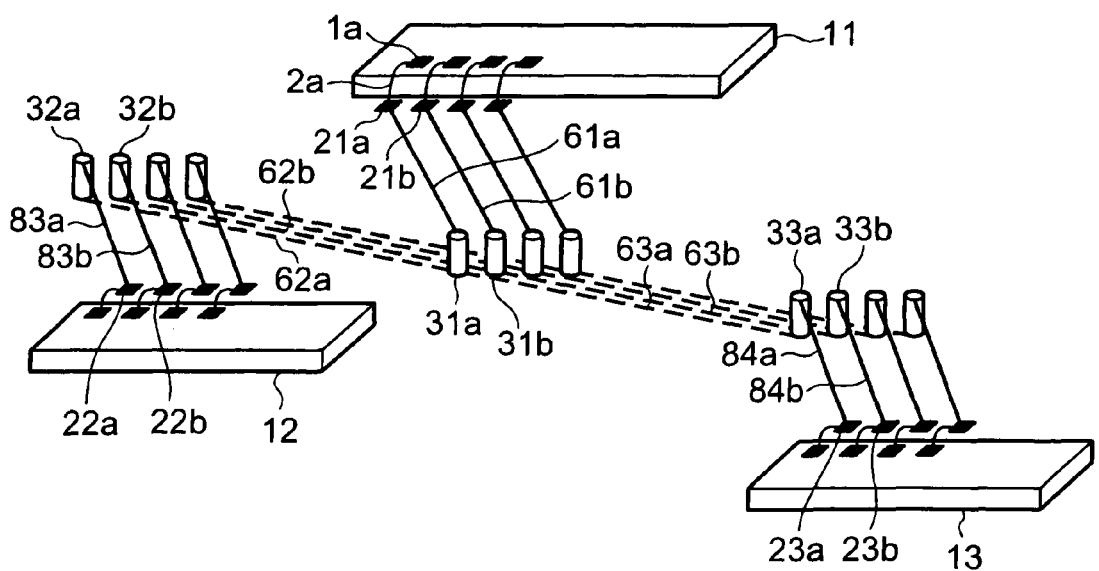
Figure 3A:
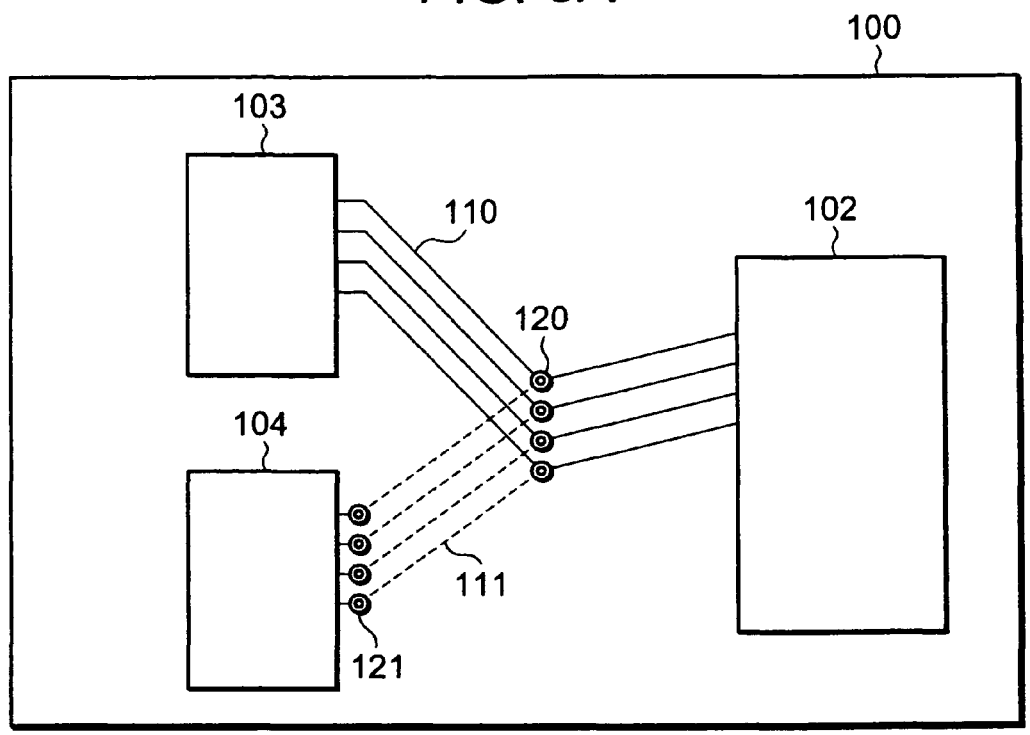
FIGS. 3A and 3B are views schematically showing a structure of a conventional printed circuit board.
Figure 3B:
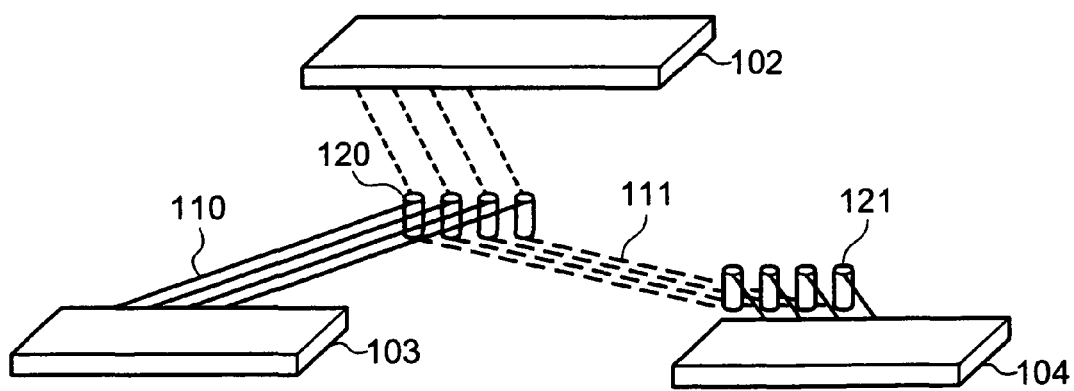

FIGS. 2A and 2B are views schematically showing a structure of a wiring board according to a second example of the present invention. FIG. 2A is a plan view and FIG. 2B is a perspective view showing a wiring board 10a. Here, FIGS. 2A and 2B show an example of the case where n=1. In FIGS. 2A and 2B, the same reference numerals as those in FIG. 1 represent the same elements and description thereof will be omitted.

In FIG. 2B, a wire is provided between a terminal (bonding pad) 1a of a semiconductor chip 11 and a connection point (pad) 21a by use of a bonding wire 2a. For connection points (pads) 21b to 21d, wires are similarly provided. Moreover, for semiconductor chips 12 and 13, wires are similarly provided. Note that reference numerals for the wiring up to the connection points 21c and 21d are omitted to simplify the illustration.

The wiring up to the connection point 21a, the wiring up to the connection point 21b, the wiring up to the connection point 21c and the wiring up to the connection point 21d have the same wiring structure as that in Example 1. However, here, a depth n in the tree structure is 1, and a second end of a via 32a is connected to a wire 83a and a second end of a via 33a is connected to a wire 84a.

In the wiring board 10a having the structure as described above, the wiring paths that lead from the connection point 21a to respective connection points 22a and 23a, the wiring paths that lead from the connection point 21b to respective connection points 22b and 23b, the wiring paths that lead from the connection point 21c to respective connection points 22c and 23c, and the wiring paths that leads from the connection point 21d to respective connection points 22d and 23d are all set to have a completely equal length including the length of each via. Here, between the respective terminals of the semiconductor chips 11 to 13 and the connection points for the respective terminals of the semiconductor chips 11 to 13, for example, solder balls, bonding wires, lead terminals or the like, which connect bumps on the semiconductor chips to the pads on the board, are provided and assumed to have approximately the same length. Therefore, as long as the bonding wires have the same length, there is no difference in wiring delay among the paths. Note that FIGS. 2A and 2B show the example where the semiconductor chips are connected to the wiring board through the bonding wires. Meanwhile, in such a case as where the semiconductor chips have lead terminals, the lead terminals may be connected to the connection points on the wiring board.

Note that a difference between wiring paths 61a, 61b, in the wiring structure shown in FIGS. 2A and 2B and the second wiring patterns in the first and second wirings described in Example 1 can be simply seen as a difference in configuration.

Although the present invention has been described above according to the foregoing examples, the present invention is not limited thereto. As a matter of course, the present invention includes various changes and modifications that can be made by those skilled in the art within the scope of the invention according to each claim of the scope of claims in the present application.

And the present invention is applied to not only the connection of between a plurality of semiconductor chips but also various connection for signal transmission.

What is claimed is:

1. A wiring board comprising:
   first to $2^n+1$th terminal group each having first and second terminals;
   a first wiring within the wiring board associated with said first terminals; and
   a second wiring within the wiring board associated with said second terminals;
   wherein
   said first wiring and second wiring are in a positional relationship of being shifted parallel to each other in a planar direction of the wiring board so as not to come into electrical contact with each other,
   each of the first and second wirings having a binary tree structure having a plurality of nodes arranged in a plurality of depths, where a node in one depth is coupled to more than one nodes in adjacent lower depth in respective branches, in which all leaves are at the same depth from a root, said first terminal group being associated with said root, said second to $2^n+1$th terminal group being positioned at the respective leaves, said branches including vias, and said branches at the same depth in the tree structure having the same length with each other.

2. The wiring board according to claim 1, wherein, each of the first and second wirings includes;
   a first via at a node in a depth,
   a first branch of said one node toward a leaf direction including a second via, and
   a second branch of said one node toward the leaf direction including a third via,
   wherein
   one wiring coupled between the first and second vias has a length same as another wiring coupled between the first and third vias.

3. The wiring board according to claim 2, wherein said one wiring and said another wiring belong to the same wiring layer with each other of said board.

4. The wiring board according to claim 3, wherein branches at the same depth as said first and second branches in the tree structure are provided in the same wiring layer with each other.

5. The wiring board according to claim 4, wherein a wire from a second end of the second via to a second end of a first via art a next node and a wire from a second end of the third via to a second end of another first via at a next node in each of the branches at the same depth in the tree structure are provided in another same wiring layer.

6. The wiring board according to claim 5, wherein a wire from the connection point for the terminal in the first semiconductor chip to the second end of the first via at the position of the root, a wire from the second end of the second via to the second end of the first via at the next node in each of the branches, a wire from the second end of the second via to the connection point at the leaf in each of the branches, a wire from the second end of the third via to the second end of another first via at the next node in each of the branches and a wire from the second end of the third via to the connection point at another leaf in each of the branches are provided in a first wiring layer, and
the wires between the first ends of the first and second vias and the wires between the first ends of the first and third vias are provided in a second wiring layer.

7. An electronic device comprising:
   first to $2^n+1$th semiconductor chips; and
   the wiring board according to claim 1,
   wherein each of said chips is coupled to respective one of said group.

8. A wiring board comprising:
   first and second terminal groups,
   a first wiring couples to a first connection point and first terminals in the first and second terminal groups; and
   a second wiring coupled to a second connection point and second terminals in the first and second terminal groups,
   wherein
   each of the first and second wirings includes
   a first via,
   a second via,
   a first wiring pattern which connects a first end of the first via to a first end of the second via in a first wiring layer,
   a branch point formed in the middle of the first wiring pattern,
   a second wiring pattern which has a first end coupled to the branch point,
   a third wiring pattern which has a first end coupled to a second end of the first via in a second wiring layer, and
   a fourth wiring pattern which has a first end coupled to a second end of the second via in the second wiring layer and has a length equal to that of the third wiring pattern.

9. The wiring board according to claim 8,
   wherein in the first wiring, a second end of the second wiring pattern is connected to the first connection point, a second end of the third wiring pattern is connected to a connection point for the first terminal in the first semiconductor chip, and a second end of the fourth wiring pattern is connected to a connection point for the first terminal in the second semiconductor chip,
   wherein in the second wiring, the second end of the second wiring pattern is connected to the second connection point, the second end of the third wiring pattern is connected to a connection point for the second terminal in the first semiconductor chip, and the second end of the fourth wiring pattern is connected to a connection point for the second terminal in the second semiconductor chip,
   wherein the first and second wirings are in a relationship of being mapped parallel to each other in a planar direction of the wiring board, so as not to come into electrical contact with each other.

10. The wiring board according to claim 8,
    wherein in the first wiring, a second end of the second wiring pattern is connected to the first connection point, a second end of the third wiring pattern is connected to a connection point for the first terminal in the first semiconductor chip, and a second end of the fourth wiring pattern is connected to a connection point for the first terminal in the second semiconductor chip, wherein in the second wiring, the second end of the second wiring pattern is connected to the second connection point, the second end of the third wiring pattern is connected to a connection point for the second terminal in the first semiconductor chip, and the second end of the fourth wiring pattern is connected to a connection point for the second terminal in the second semiconductor chip, wherein the first and second wirings are in a relationship of being mapped parallel to each other in a planar direction of the wiring board, and wherein said terminals in said first group are arranged along one direction not parallel with each of said first to fourth wiring patterns.

11. The wiring board according to claim 8, wherein a second end of said second wiring pattern of each of said first and second wirings coupled to respective one of terminals of a third terminal group.

* * * * *